United States Patent [19]

Rogers, Jr.

[11] 4,087,756

[45] May 2, 1978

[54] FM FEEDBACK DEMODULATOR HAVING THRESHOLD EXTENSION CIRCUIT WITH TWO-POLE CRYSTAL FILTERS

[75] Inventor: Walter McDowell Rogers, Jr., Indialantic, Fla.

[73] Assignee: Harris Corporation, Cleveland, Ohio

[21] Appl. No.: 806,593

[22] Filed: Jun. 14, 1977

[51] Int. Cl.$^2$ .......................... H03D 3/06; H04B 1/26
[52] U.S. Cl. .................................... 329/50; 325/346; 325/348; 325/349; 325/423; 325/438; 329/117; 329/122; 333/72
[58] Field of Search .................. 329/50, 117, 118, 122, 329/124, 125; 325/344–346, 348, 349, 423, 438

[56] References Cited

U.S. PATENT DOCUMENTS

| 3,231,822 | 1/1966 | Tillotson | 325/346 |
| 3,517,268 | 6/1970 | Webb | 329/122 |
| 3,742,361 | 6/1973 | Wason | 329/50 X |

Primary Examiner—Siegfried H. Grimm
Attorney, Agent, or Firm—Craig & Antonelli

[57] ABSTRACT

Demodulation of FM signals employing an FM feedback loop of the present invention includes a first mixer circuit for mixing an IF input signal with a voltage controlled oscillator signal to down-convert the IF input signal to a prescribed center frequency IF signal. This signal is coupled through a tuned amplifier having an automatic gain control loop and is then filtered in a predetection filter and amplified. The predetection filter is composed of a two-pole crystal bandpass filter having a very narrow bandwidth. The filtered signal is then coupled to a frequency discriminator circuit comprised of a frequency detection second mixer and filter circuit, the frequency detection filter circuit being composed of a second two-pole crystal bandpass filter, the bandwidth of which is an order of magnitude larger than that of the predetection filter. The output of the frequency discriminator is coupled through a loop compensation filter to the voltage controlled oscillator so that changes in the output frequency of the voltage controlled oscillator reduce the deviation of the FM signal in the intermediate frequency and frequency discriminator stages. The use of two-pole crystal bandpass filters improves the frequency stability of the system and significantly reduces post detection noise levels, as compared with conventional limiter/discriminator techniques. The two-pole crystal bandpass filters have a Butterworth configuration. In addition to the FM feedback loop, a squelch circuit is also coupled to the output of the frequency discriminator.

7 Claims, 3 Drawing Figures

FM FEEDBACK DEMODULATOR HAVING THRESHOLD EXTENSION CIRCUIT WITH TWO-POLE CRYSTAL FILTERS

FIELD OF THE INVENTION

The present invention relates to an FM demodulator circuit, especially a narrow band frequency modulation feedback (FMFB) demodulator for single channel per carrier (SCPC) signals, employing threshold extension techniques. The specific FMFB threshold extension circuit of the present invention incorporates two-pole crystal filters which improve frequency stability.

BACKGROUND OF THE INVENTION

Techniques for demodulating FM signals have encompassed the use of frequency modulation feedback and phase-locked loop receivers, in an effort to achieve useful operation at an input signal-to-noise ratio which is lower than that at which a standard limiter/discriminator receiver can deliver a usable output. Threshold extension applications have also included the use of direct tracking filter circuits incorporating a phase comparator to directly tune a pair of narrow pass band filters, as described in U.S. Pat. No. 2,976,408. This and other implementations are further described in an article entitled "A New Threshold Extension Demodulator for FM Multiplex" by N. C. Hekimian et al, EASCON '69 RECORD', pages 53 – 61. Such techniques have been employed for demodulation of multi channel signals and, while they provide an improvement over a conventional linear FM discriminator, they do not afford the degree of refinement sought for SCPC (single channel per carrier) FM signals.

SUMMARY OF THE INVENTION

In accordance with the present invention, a technique has been developed for demodulating FM signals using FMFB threshold extension techniques which particularly improves the characteristics of the demodulated output and imparts a significant degree of frequency stability to the operation of the demodulator. The invention is especially adapted for demodulating SCPC signals.

Briefly, the improved FM feedback demodulator of the present invention receives an IF input signal and down-converts the IF signal frequency in a first mixer circuit and supplies this down-converted signal to a first tuned amplifier stage. The resultant signal, the gain of which is controlled in a conventional AGC fashion, is then supplied to a two-pole crystal filter tuned to the down-converted frequency and having a prescribed vary narrow band width for the signals of interest and a maximally flat amplitude response. The output of the crystal filter is applied through a limiter-amplifier stage to a signal splitter, one output of which feeds a second mixer circuit. The other splitter output is coupled to a second two-pole crystal filter which, like the first two-pole crystal filter, is tuned to the down-converted frequency; however, the band width of the second two-pole crystal filter is approximately an order of magnitude greater than the band width of the first filter. The output of the second two-pole crystal filter is also coupled to the second mixer. The second two-pole crystal filter and the second mixer form an FM detection discriminator, the output characteristic of which is a discriminator "S" curve centered at the down-converted frequency. The output of the second mixer is coupled through a double-lag, double-lead FMFB loop compensation filter which drives a loop voltage controlled oscillator. The output of the voltage controlled oscillator is applied to another input port of the first mixer for effecting the above-described down-conversion of the IF input signal. From the output of the FMFB loop compensation filter there is also derived a recovered demodulator baseband signal.

The FMFB loop varies the frequency of the voltage controlled oscillator in step with the level of the FM discriminator output. The output frequency of the voltage controlled oscillator changes in the appropriate direction to reduce the deviation of the FM signal through the IF and limitor/discriminator stages. This deviation reduction permits operation of the system with the IF filtered to a narrower bandwidth than would otherwise be required. This action reduces noise levels and improves performance of low $C/N_o$ (carrier to noise density) ratios. The D.C. feedback through the FM feedback loop also provides control of the center frequency of the voltage controlled oscillator.

The recovered base band signal is further supplied to a squelch circuit which senses the level of the out-of-band FM noise above 19kHz.

DETAILED DESCRIPTION

Figure 1:
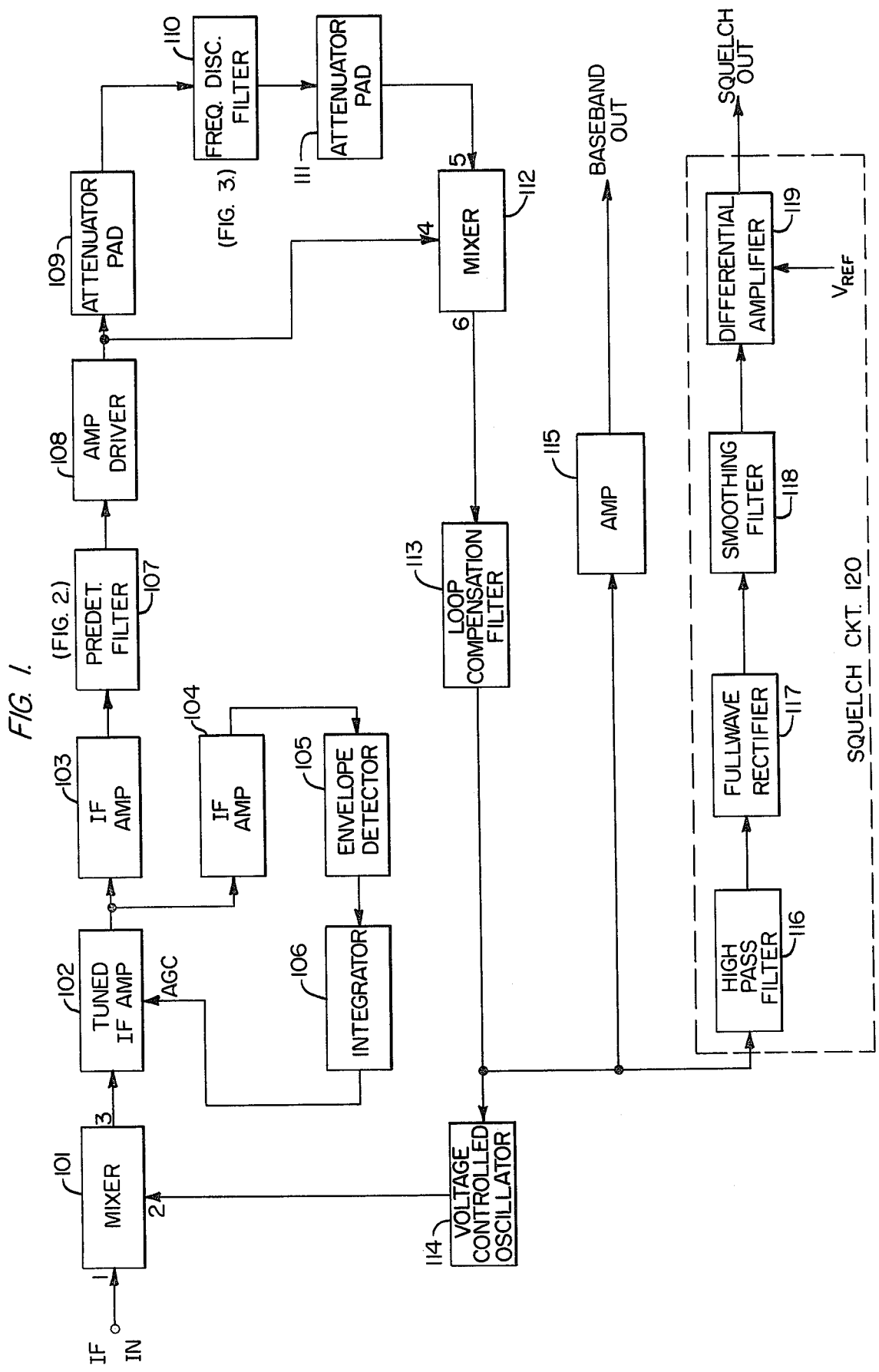
FIG. 1 is a schematic block diagram of an SCPC FMFB demodulator according to the present invention.

Referring now to FIG. 1, there is illustrated the overall configuration of the FMFB demodulator of the present invention. In order to facilitate the illustration and description of the invention, the individual components which are employed in the combination of the present invention are illustrated in block diagram format since the details of the elements, themselves, are conventional and are known to those skilled in the art. Of course, with respect to the specific improved portion of the demodulator according to the present invention, more specific illustrations are provided in FIGS. 2 and 3, which respectively depict the details fo the predetection filter 107 and frequency discriminator filter 110, to be described below.

Looking now at the circuit configuration in FIG. 1, at a first input port 1 of a first mixer circuit 101 an IF input signal containing FM modulation information to be recovered is applied. A local oscillator signal supplied from voltage controlled oscillator 114 is supplied to the other input port 2 of mixer 101. At the output port 3 there is derived a down-converted frequency signal which is coupled to a tuned IF amplifier 102. In the exemplary embodiment depicted and described, the frequency of the IF input signal supplied to input port 1 is 44.9975 MHz while the output frequency of the voltage controlled oscillator is 13.4975 MHz which combines in the mixer 101 with the IF input signal to produce a down-converted frequency signal of 31.5000 MHz.

This 31.5000 MHz down-converted signal is coupled through a tuned IF amplifier 102 to a further IF amplifier 103. Automatic gain control of the output of the tuned amplifier 102 is effected by an AGC circuit consisting of IF amplifier 104, envelope detector 105, and integrator 106, connected in series between the output of tuned amplifier 102 and its AGC control terminal.

Figure 3:
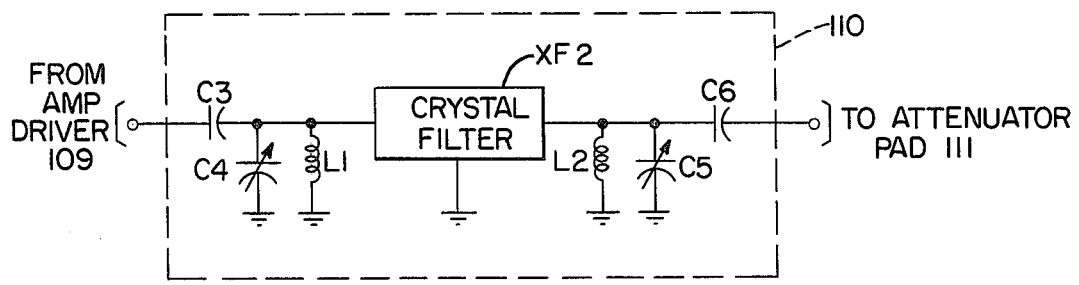
FIG. 3 is a detailed illustration of the circuitry configuration of the two-pole crystal filter employed in the FM detection discriminator portion of the circuit shown in FIG. 1.

The output of IF amplifier 103 is fed to a two-pole monolithic crystal filter 107, which is tuned to the down-converted frequency of 31.5 MHz. The bandwidth of the filter 107 is on the order of 16kHz and has a maximally flat amplitude response. The output of filter 107 is supplied to an amplifier driver 108 which includes a limiter stage and a linear amplifier, the output of which is connected to a second mixer 112 and a frequency discriminator filter network. The frequency discriminator filter network includes a first attenuator pad 109 which is formed of a voltage divider network to attenuate the level of the output of the amplifier driver 108 to an appropriate amplitude to be processed by the frequency discriminator filter 110. The output of the frequency discriminator filter 110 is coupled through a further attenuator pad 111 to input 5 of mixer 112. Frequency discriminator filter 110, the details of which are shown in FIG. 3, comprises another two-pole monolithic crystal filter which is tuned to the 31.5000 MHz frequency. However, the bandwidth of frequency discriminator filter 110 is approximately on the order of magnitude greater than that of predetection filter 107.

The phase shift through filter 110 varies with frequency and at the tuned center frequency of 31.5000 MHz, the phase shift is 90°. Frequency discriminator filter 110 and mixer 112 effectively form an FM discriminator which has a discriminator "S" curve centered at 31.5000 MHz with a peak-to-peak bandwidth of approximately 100 kHz.

From the output port 6 of mixer 112, the signal is coupled through a loop compensation filter 113 which is formed of a pair of series-connected operational amplifier circuits having appropriate RC feedback connections to form a double-lag, double-lead FMFB loop compensation filter. The voltage output of loop compensation filter 113 controls the frequency of voltage controlled oscillator 114, the output of which, as mentioned previously, is fed to input 2 of mixer 101. The signal is also supplied to amplifier 115 from which the baseband output signal is derived and a squelch circuit 120 consisting of high-pass filter 116, fullwave rectifier 117, smoothing filter 118, and differential amplifier 119. The squelch circuit 120 senses the level of the out-of-band FM noise greater than 19 kHz. The noise is quieted considerably whenever a useful signal is present. This is effected by applying the output of the loop compensation filter 113 through four-pole active highpass filter 116 with a −6dB corner frequency of 19 kHz. The output of filter 116 feeds a precision full-wave rectifier 117 and a smoothing filter 118. The output of the smoothing filter 118 is a varying D. C. voltage which is proportional to the average value of the noise. This is fed to a voltage comparator which is formed of a differential amplifier 119 which compares the varying voltage with a reference voltage $V_{REF}$. The output of the squelch circuit is on the order of −12 volts for squelch and +12 volts for non-squelch. The squelch output voltage is employed to gate a series field effect transistor switch in the external baseband signal processor. (Not shown.)

Figure 2:
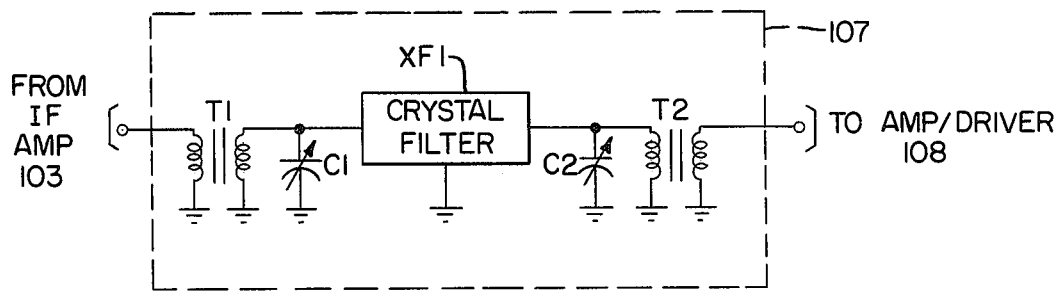
FIG. 2 is a detailed illustration of the circuitry configuration of the two-pole crystal predetection filter 107 of the circuit configuration shown in FIG. 1.

Referring now to FIG. 2, there is shown a detailed illustration of the predetection filter 107, which comprises a pair of coupling transformers T1 and T2, with variable tank capacitors C1 and C2. Connected between the variable capacitors C1 and C2 is a two-pole monolithic crystal filter XF1 which has a nominally Butterworth amplitude response. The bandwidth of the filter is 16 kHz.

A detailed illustrated of the frequency discriminator filter 110 is shown in FIG. 3, wherein a crystal filter XF2 similar to the crystal filter XF1, shown in FIG. 2, is coupled between a set of tank circuits consisting of capacitors C3, C4, and inductor L1 and capacitors C6 and C5 and inductor L2, respectively. The bandwidth of the frequency discriminator filter 110 is on the order of 160 kHz.

As was pointed out previously, the operation and frequency stability of the FM feedback loop of the demodulator in accordance with the present invention is significantly enhanced by the use of two-pole crystal filters for predetection and frequency discrimination. The two filters track over temperature and are subject to very little drift. Alignment of the filters is not difficult, initially, and is insensitive to aging and temperature variations. Thus, the effect provided by the two-pole crystal filters is particularly noticable in the feedback control of the voltage controlled oscillator.

As was described previously, the FMFB loop varies the frequency of the voltage controlled oscillator 114 in accordance with the level of the discriminator output. The output frequency of the voltage controlled oscillator is varied in the appropriate direction to reduce the deviation of the FM signal through the IF and amplifier-filter/discriminator stages. This deviation reduction permits the operation of the system with the IF signal filtered to a bandwidth much narrower than would otherwise be required. Thus, the demodulator with its two-pole crystal filters of the present invention is especially adapted for demodulating single channel per carrier input signals and is particularly suited for satellite communications systems wherein the reduction of noise level and improved performance at low $C/N_o$ ratios are of paramount importance.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. In a frequency modulation feedback demodulator having:
    a first mixer circuit for receiving an IF input FM signal and a local oscillator signal and converting said IF input FM signal to a first frequency-converted IF FM signal,
    an IF amplifier stage coupled to said first mixer circuit for amplifying and selectively filtering said first frequency-converted IF FM signal within a first prescribed narrow bandwidth,
    an FM discriminator stage, coupled to said IF amplifier stage, for selectively filtering the output of said IF amplifier stage within a second prescribed narrow bandwidth wider than said first prescribed narrow bandwidth, and mixing the selectively filtered output of said IF amplifier stage with the output of said IF amplifier stage to obtain an FM detection discriminator output signal, a controlled oscillator having an output coupled to said first mixer circuit for supplying said local oscillator signal to said first mixer circuit, and a feedback connection coupling the output of said FM discriminator stage to said controlled oscillator for causing the frequency of the local oscillator signal to change to reduce the deviation of the FM signal through said IF amplifier and FM discriminator stages, the improvement wherein said IF amplifier stage includes a predetection filter comprising a two-pole bandpass filter having said first prescribed bandwidth, said FM discriminator stage includes a frequency discriminator filter comprising a two-pole bandpass filter having said second prescribed bandwidth.

2. The improvement according to claim 1, wherein each of said two-pole bandpass filters comprises a two-pole crystal filter.

3. The improvement according to claim 2, wherein said IF input FM signal is a single channel per carrier FM signal.

4. A method of demodulating a single channel per carrier FM signal comprising the steps of:

(a) combining said single channel per carrier FM signal at a prescribed intermediate frequency in a first mixer circuit with a local oscillator signal so as to convert said FM signal to a first frequency converted IF FM signal, (b) selectively filtering and amplifying said first frequency-converted IF FM signal within a first prescribed narrow bandwidth, (c) further selectively filtering the signal obtained from step (b) within a second prescribed narrow bandwidth greater than said first prescribed narrow bandwidth while controlling the phase of said obtained signal in accordance with the frequency thereof, (d) combining the signals obtained from steps (b) and (c) in a second mixer circuit to provide an FM discriminator output signal, and (e) controlling said local oscillator signal in accordance with the level of said FM discriminator output signal, and wherein each of steps (b) and (c) includes the selective filtering of said first frequency-converted IF FM signal and the signal obtained from step (b), respectively, in a respective two-pole crystal bandpass filter having said first and second prescribed narrow bandwidths, respectively.

5. A frequency modulation feedback demodulator for demodulating single channel per carrier FM input signals comprising:

a first mixer circuit having a first input port to which an intermediate frequency FM input signal is applied, a second input port to which a local oscillator signal is supplied, and an output port from which a first frequency-inverted IF FM signal is derived;

a tuned IF amplifier circuit connected to the output port of said first mixer circuit and having an automatic gain control loop for controlling the output amplitude thereof;

an IF amplifier circuit coupled to the output of said tuned IF amplifier;

a predetection filter comprised of a two-pole crystal bandpass filter having a first prescribed narrow bandwidth coupled to the output of said IF amplifier circuit;

an amplifier driver circuit connected to the output of said predetection filter;

a frequency/discriminator network including a series-connected attenuator/frequency detection filter circuit, including a two-pole crystal filter having a second prescribed narrow bandwidth greater than said first prescribed narrow bandwidth, coupled to the output of said amplifier driver circuit, and a second mixer circuit having a first input port connected to the output of said amplifier driver circuit, a second input port coupled to said two-pole crystal filter having said second prescribed bandwidth, and an output port;

a loop compensation filter connected to the output port of said mixer circuit;

a voltage controlled oscillator having an input coupled to said loop compensation filter and an output connected to the said second input port of said first mixer circuit for supplying said local oscillation signal thereto; and an output amplifier circuit coupled to the output of said loop compensation filter from which a baseband demodulated FM signal is derived.

6. A frequency modulation feedback demodulator according to claim 5, further comprising a squelch circuit connected to the output of said loop compensation filter, said squelch circuit including a highpass filter receiving the output of said loop compensation filter, a fullwave rectifier connected to the output of said highpass filter, a smoothing filter connected to the output of said fullwave rectifier, and a differential amplifier comparator circuit for comparing the output voltage level of said smoothing filter with a reference voltage level, the squelch output signal being derived from said differential amplifier comparator circuit.

7. A frequency modulation feedback demodulator according to claim 6, wherein said automatic gain control loop comprises an IF amplifier connected to the output of said tuned IF amplifier circuit, an envelope detector connected to the output of said IF amplifier, and an integrator circuit connected between the output of said envelope detector and an AGC control terminal of said tuned IF amplifier circuit.

* * * * *